(12) United States Patent
Johnson et al.

(10) Patent No.: US 6,587,804 B1
(45) Date of Patent: Jul. 1, 2003

(54) METHOD AND APPARATUS PROVIDING IMPROVED DATA PATH CALIBRATION FOR MEMORY DEVICES

(75) Inventors: Brian Johnson, Boise, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 136 days.

(21) Appl. No.: 09/637,088

(22) Filed: Aug. 14, 2000

(51) Int. Cl.$^7$ ................................................. G06F 1/12
(52) U.S. Cl. ........................ 702/107; 702/79; 702/69; 702/178; 713/503
(58) Field of Search ....................... 702/107, 71, 78, 702/80, 79, 69, 117, 124, 125, 178, 189, FOR 103, FOR 104, FOR 109, FOR 110, FOR 139, FOR 156, FOR 170; 365/189.12, 194, 233; 710/104, 305; 713/400, 401, 503, 600; 711/167–169; 714/731, 708; 327/292; 324/601

(56) References Cited

U.S. PATENT DOCUMENTS

| | | | |
|---|---|---|---|
| 5,841,580 A | 11/1998 | Farmwald et al. | 365/194 |
| 5,917,760 A | 6/1999 | Millar | 365/194 |
| 5,953,263 A | 9/1999 | Farmwald et al. | 365/194 |
| 6,016,282 A | 1/2000 | Keeth | 365/233 |
| 6,035,365 A | 3/2000 | Farmwald et al. | 710/305 |
| 6,038,195 A | 3/2000 | Farmwald et al. | 365/233 |
| 6,041,419 A * | 3/2000 | Huang et al. | 713/401 |
| 6,067,592 A | 5/2000 | Farmwald et al. | 710/104 |
| 6,101,152 A | 8/2000 | Farmwald et al. | 365/233 |
| 6,105,145 A * | 8/2000 | Morgan et al. | 713/501 |
| 6,434,081 B1 * | 8/2002 | Johnson et al. | 365/194 |

OTHER PUBLICATIONS

Gillingham; "SLDRAM Architectural and Functional Overview"; SLDRAM Consortium, Aug. 29, 1997, pp. 1–14.

* cited by examiner

*Primary Examiner*—Hal Wachsman
(74) *Attorney, Agent, or Firm*—Dickstein Shapiro Morin & Oshinsky LLP

(57) ABSTRACT

A method and apparatus for calibrating a data path of a digital circuit uses an even bit pseudo-random calibration pattern. A portion of the pattern is captured in a capture period and used to predict a next arriving portion of the calibration pattern. The next arriving portion of the calibration pattern is captured and then compared to the predicted pattern in a compare period, and the result of the comparison is used to relatively time data arriving in the data path to a clocking signal which clocks in the data. The time duration of the compare period may be varied to ensure that all possible bits of the calibration pattern are used in the calibration procedure.

16 Claims, 6 Drawing Sheets

METHOD AND APPARATUS PROVIDING IMPROVED DATA PATH CALIBRATION FOR MEMORY DEVICES

FIELD OF THE INVENTION

The present invention relates to a method and apparatus for improving calibration of data paths in memory devices.

DISCUSSION OF THE RELATED ART

Memory devices are constantly evolving in the directions of faster speed and higher memory density. To this end, dynamic random access memory (DRAM) devices have evolved from simple DRAM devices to extended data output (EDO) to static random access memory (SRAM) to double data rate static random access memory (DDR SRAM) to synchronous link dynamic random access memory (SLDRAM), the latter of which is the subject of much current industry interest. SLDRAM has a high sustainable bandwidth, low latency, low power, user upgradeability and support for large hierarchical memory applications. It also provides multiple independent banks, fast read/write bus turn-around, and the capability for small fully pipelined burst.

One characteristic of modern high speed memory devices is that they use both the positive- and negative-going edges of a clock cycle to READ and WRITE data from/to the memory cells and to receive command and FLAG data from a memory controller.

An overview of one type of high speed memory device, an SLDRAM, can be found in the specification entitled "SLDRAM Architectural and Functional Overview," by Gillingham, 1997 SLDRAM Consortium (Aug. 29, 1997), the disclosure of which is incorporated by reference herein.

Because of the required high speed operation of SLDRAM, and other contemporary memory devices, system timing and output signal drive level calibration at start-up or reset is a very important aspect of the operation of such devices to compensate for wide variations in individual device parameters.

One of the several calibration procedures which is performed in current SLDRAM devices is a timing synchronization of clock signals CCLK (command clock signal) and DCLK (data clock signal) with data provided on an incoming command data path CA and FLAG data path (for the CCLK signal) and on the READ/WRITE data paths DQ (for the DCLK signal) so that incoming data is correctly sampled. Currently, a memory controller achieves this timing calibration at system initialization by sending continuous CCLK and DCLK signals on those clock paths and transmitting inverted and non-inverted versions of a fifteen-bit repeating pseudo-random SYNC sequence "111101011001000" on each of the data paths DQ, the command data path CA, and the FLAG data path. The SLDRAM recognizes the beginning of the transmission of this pseudo-random sequence from a memory controller by the appearance of a predetermined bit pattern appearing on the FLAG data path and determines an optimal relative internal delay for CCLK and DCLK to optimally sample the known bit pattern. This optimal delay is achieved by adjusting the position of the received data bits to achieve a desired bit alignment relative to the clock. This is accomplished by adjusting a delay in the receiving data path until the received data is properly sampled by the clock and recognized internally. Once synchronization has been achieved, that is, the proper delays on the data receiving paths have been set, the memory controller stops sending the SYNC sequence and the SLDRAM, after all calibrations are completed, can be used for normal memory READ and WRITE access.

In order to improve reliability of calibration of incoming data to a correct edge of the clock (CCLK or DCLK), an even bit (e.g., sixteen-bit) repeating pseudo-random SYNC sequence, e.g., 1111010110010000, has been proposed to be used in place of the fifteen-bit pseudo-random sequence in the pending U.S. application Ser. No. 09/568,155 filed on May 10, 2000, and entitled IMPROVED CALIBRATION PATTERN FOR SLDRAM, the disclosure of which is incorporated herein by reference.

The even bit pattern works well in attaining desired calibration, but the randomness of the pattern cannot be fully exploited in some predictive calibration techniques when the receiving memory device has only one serial register in the control logic for registering incoming data bits. This limitation is illustrated by the circuit diagram of FIG. 1 and the timing diagram of FIG. 2.

FIG. 1 illustrates a simplified proposed predictive calibration circuit for positioning a clocking edge of clock signal CCLK at the center of a data eye to latch data arriving on one command data path CAØ of a command and address bus CAØ . . . CA9 of a memory storage device. The data on the data path CAØ passes through a buffer amplifier 11, an adjustable ring delay circuit 13 and is latched in by latch 15. During calibration, the data appearing on the CAØ data path is a known repeating even-bit calibration pattern, e.g. 1111010110010000, which is sequentially latched bit-by-bit by data latch 15 on a clocking edge of the clock signal CCLK. The data on the data path CAØ arrives in four-bit data bursts and are latched into the memory device by rising and falling clocking edges of CCLK. The period defined by a rising or falling edge of a clock signal which extends to the next rising or falling edge is referred to herein as a clock "tick." Calibration techniques are used to center a rising or falling clocking edge in the data eye, which is the period of time where the data is valid on the data path, at start-up and reset of the memory device so that the memory device can properly latch in data during subsequent READ/WRITE operations.

One such proposed calibration technique, illustrated in FIGS. 1 and 2, involves receiving a four-bit data burst of the calibration pattern in a register 17, using the registered four bits to predict a subsequently arriving four bits with a predictor circuit 19, and then comparing in compare circuit 21 the predicted four bits with the subsequently arriving four bits loaded in register 17. Register 17 is loaded with four bits during periods of time known as capture periods and the comparison of a predicted bit patterns with an arriving bit pattern occurs during a compare period which occurs in between successive capture periods. The capture and compare periods are produced by a symmetric clock generator 27 from the received CCLK clock signal and are shown in FIG. 2.

Referring again to FIG. 1, when the compared data is not coincident, this indicates a lack of calibration to a delay adjust circuit 23 which adjusts ring delay circuit 13 to increase or decrease the amount of delay applied to the incoming data signal on the data path CAØ. This repositions the data eye of the incoming data on path CAØ relative to the clocking edges of clock signal CCLK. The process of loading a four-bit data pattern into register 17, predicting the next four bits, comparing the predicted four bits with a subsequently arriving four bits, and adjusting ring delay 13 when no coincidence is indicated by compare circuit 21 repeats until coincidence is detected at compare circuit 21, indicating that the clock transition is within the data eye of arriving data. Even with a detected coincidence, the process will typically continue until ring delay 13 is adjusted to the point where coincidence is no longer obtained. Thus, in actual practice, the FIG. 1 circuit operates by stepping through all possible delay stages of ring delay 13 and noting and storing in store and logic circuit 25 those delay values where compare circuit 21 finds coincidence of a predicted data sequence to an arriving data sequence. This establishes a range of delay values for delay 13 where data is correctly received and establishes the boundaries of the data eye. The delay adjust circuit 23 may then be operated by the store and logic circuit 25 to set a final delay for ring delay 13 which positions the clocking edge at or near the center of the data eye.

One predictive calibration technique similar to that described above in simplified form is also described in greater detail in the pending U.S. application Ser. No. 09/568,016 filed May 10, 2000, and entitled PREDICTIVE TIMING CALIBRATION FOR MEMORY DEVICES, the disclosure of which is incorporated herein by reference.

When the proposed predictive calibration circuit of FIG. 1 is used with only a single four-bit register 17 to capture incoming data and with an even bit number calibration pattern, only portions of the calibration pattern are fully utilized during calibration. This is illustrated in FIG. 2 which shows use of the clock signal CCLK to bit-wise latch the data pattern into latch 15 which proceeds from there into register 17. For purposes of illustration, FIG. 2 shows the data pattern "1111010110010000" as the arriving calibration data pattern. It should be remembered that in actuality, for an SLDRAM, data arrives in four bit data bursts clocked in latch 15 by two cycles of clock signal CCLK. When a single four-bit register 17 is used in the control logic 35, the control logic 35 must first clock in a four-bit data burst and use that registered data burst to predict a subsequently arriving and registered four-bit data burst. Assuming the first registered four bits is "1111," then the predictor circuit will predict that a subsequent four-bit pattern as "1001." This predicted value will then be compared by compare circuit 21 to the next four bits captured and registered in register 17. It should be noted that because the compare periods are interleaved with the capture periods, the predictor circuit is set to predict a four-bit pattern which will be the next four-bit pattern captured, e.g. "1001," rather than the next four-bit pattern which actually exits in the calibration pattern, e.g. "0101."

Accordingly, the control logic circuit establishes a pattern of registering four bits and generating the predictive pattern over two cycles of clock CCLK and using the next two clock cycles to compare the first captured four-bit pattern with a four-bit pattern predicted from a previously captured four-bit pattern. This process can be thought of as having a data "capture" period of two clock cycles followed by a "compare" period of two clock cycles as illustrated in FIG. 2. The arrows in FIG. 2 show how a just captured four-bit pattern, e.g. "1111," is used both in the comparison operation (arrow A) and to predict a subsequent four-bit pattern for the comparison operation which occurs after the next ensuing comparison (arrow B). Because a single four-bit register 17 is used, the capture and compare cycles must be performed sequentially and cannot overlap.

When an even number of bits are used in the calibration pattern, the capture and compare periods will repeatedly sequentially capture and compare only a portion of the entire calibration pattern which is available. For example, assuming the "1111" pattern is first captured, this is followed by a comparison of the predicted pattern "1001" with the next captured four-bit pattern. If this process repeats, then only the "1111" and subsequent "1001" patterns are used in the evaluation, while patterns "0101" and "0000" and other possible four-bit patterns of the sixteen-bit calibration pattern are never used. Thus, only a small repeating portion of the sixteen-bit calibration pattern is evaluated during calibration.

A very important attribute of the calibration pattern, which is the pseudo-random nature of the sequence, is not exploited. This pseudo-random property of the calibration pattern is what exposes inter-symbol interference (ISI) and dynamic skew of the data path. Accordingly, this limits the utility of the even-bit calibration pattern in detecting ISI and bus skew.

A method and apparatus which more fully exploits the pseudo-random nature of an even-bit pseudo-random calibration pattern when a single register is used in a predictive calibration technique would be desirable.

SUMMARY OF THE INVENTION

The present invention provides a method and apparatus which more fully utilizes the pseudo-random properties of a repeating even-bit pseudo-random calibration pattern in a predictive calibration system.

In the invention, repeating sequential capture and compare periods are utilized to capture an N-bit pattern, e.g., N=4, of the even numbered repeating M-bit calibration pattern and e.g. M=16, and to subsequently compare a predicted N-bit sequence generated from the captured pattern with a subsequently captured N-bit pattern. A constant even number of clock cycles are always used to capture the data (e.g., two clock cycles for four data bits), but the number of clock cycles used for the compare period changes from time to time.

As a result, the capture periods will not continually capture the same data pattern, and during the calibration period a larger number of N-bit sequences which are contained in the even M-bit calibration pattern, sequences which utilize all of the bits of the calibration path, will be captured and used in the calibration process, thereby more fully exploiting the pseudo-randomness of the calibration pattern. The compare period can vary between two preset values, e.g., two clock cycles, and three clock cycles for alternating compare periods, or other arrangements for varying the duration of the compare period from time to time, can be used.

In an alternative implementation of the invention, the capture and compare periods are arranged to capture and compare a larger portion of the calibration pattern, e.g. eight bits of a sixteen-bit calibration pattern, so that a larger portion of the sixteen-bit calibration pattern is used during calibration. Here, too, the captured sequences will utilize all of the bits of the calibration pattern. With this arrangement, the compare periods can be of equal duration, or can be varied to even more fully exploit the randomness of the calibration pattern.

BRIEF DESCRIPTION OF THE DRAWINGS

The above and other advantages and features of the invention will be more clearly understood from the following detailed description of the invention which is provided in connection with the accompanying drawings, in which.

DETAILED DESCRIPTION OF THE PREFERRED EMBODIMENTS

Figure 1:
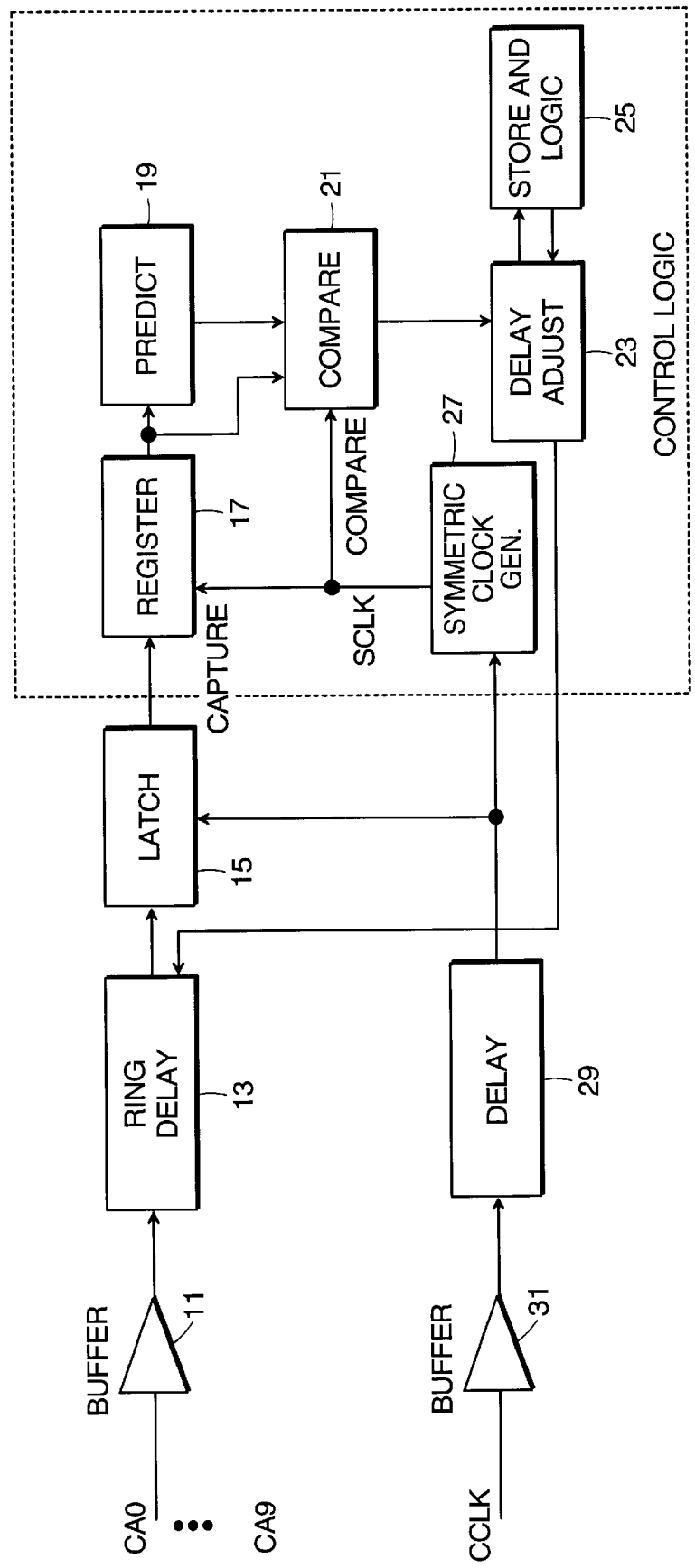
FIG. 1 is a block diagram of one proposed predictive calibration circuit for a data path of a memory device.
Figure 4:
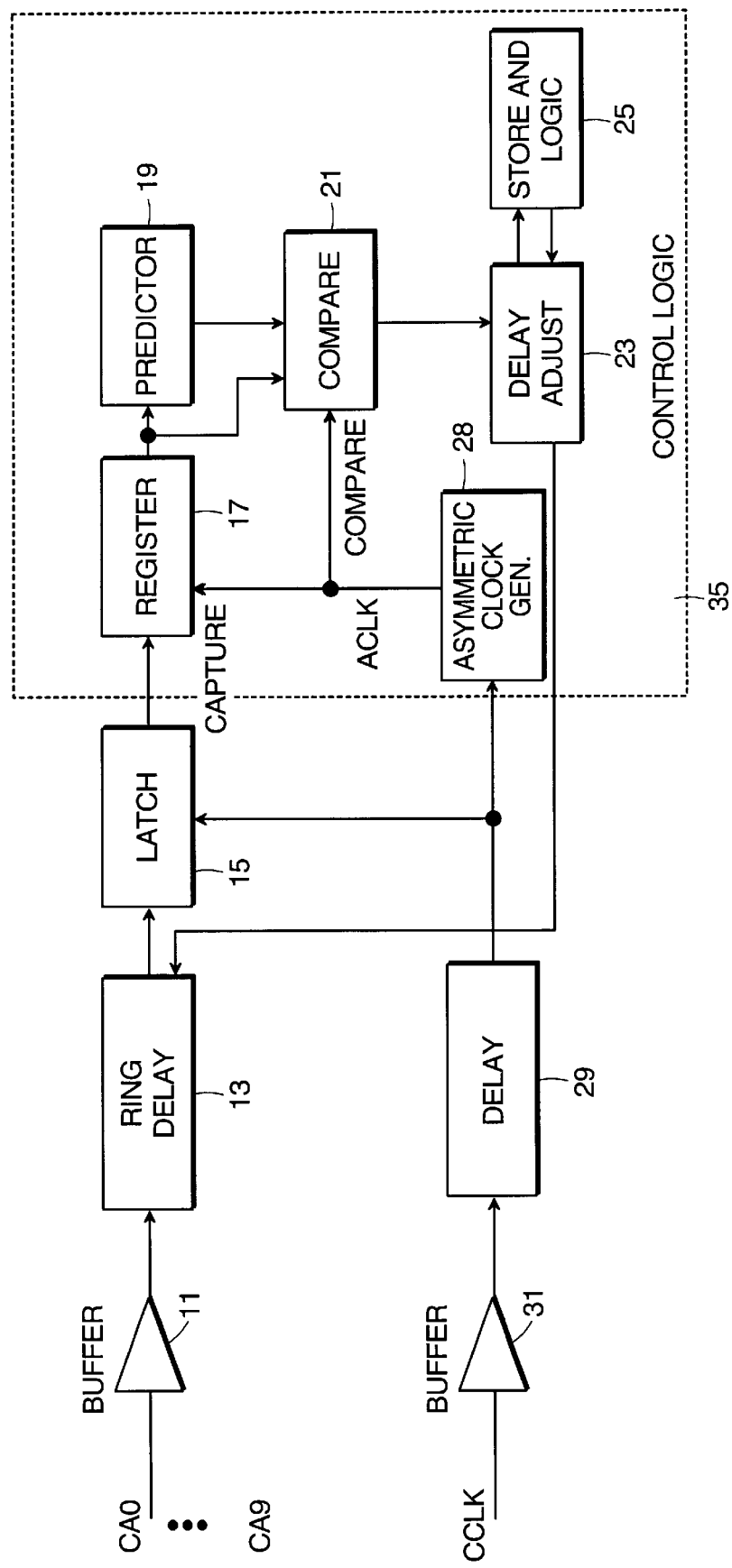
FIG. 4 is a block diagram of an exemplary embodiment of a predictive calibration system constructed in accordance with the invention.

In a first exemplary embodiment, the invention provides an asymmetric clock generator 28, FIG. 4, in place of the symmetric clock generator 27 employed in the FIG. 1 circuit. The clock generator 28 functions to vary the time duration of the compare periods so that more of the possible N-bit sequences of an even M-bit calibration pattern can be used during the calibration process described above with reference to FIG. 1. For purposes of simplification it will be assumed that M=16 and N=4, but it should be understood that these values are merely exemplary of an embodiment of the invention and that other values can be used as well.

Figure 2:
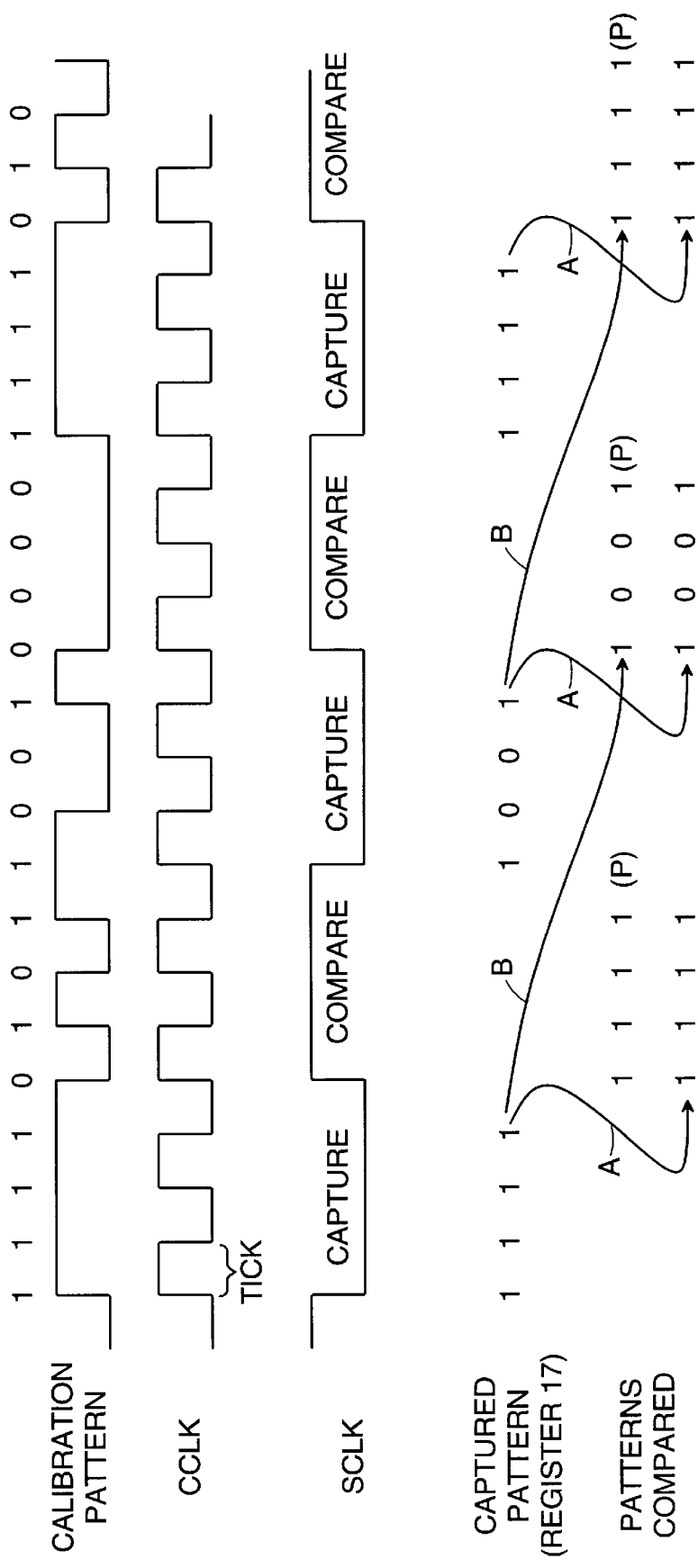
FIG. 2 illustrates signal patterns associated with the operation of the FIG. 1 circuit.

In the invention, instead of the compare period always being two clock cycles long, as in the FIG. 1 circuit and shown in FIG. 2, it now varies. For example, in the first exemplary embodiment described in more detail below, successive capture periods alternate between being two clock cycles long and three clock cycles long. Other capture period durations are also possible, the important point being that the capture periods are not all of the same duration. This causes more of the possible N-bit patterns of the M-bit calibration pattern to be used in the calibration process.

Figure 3:
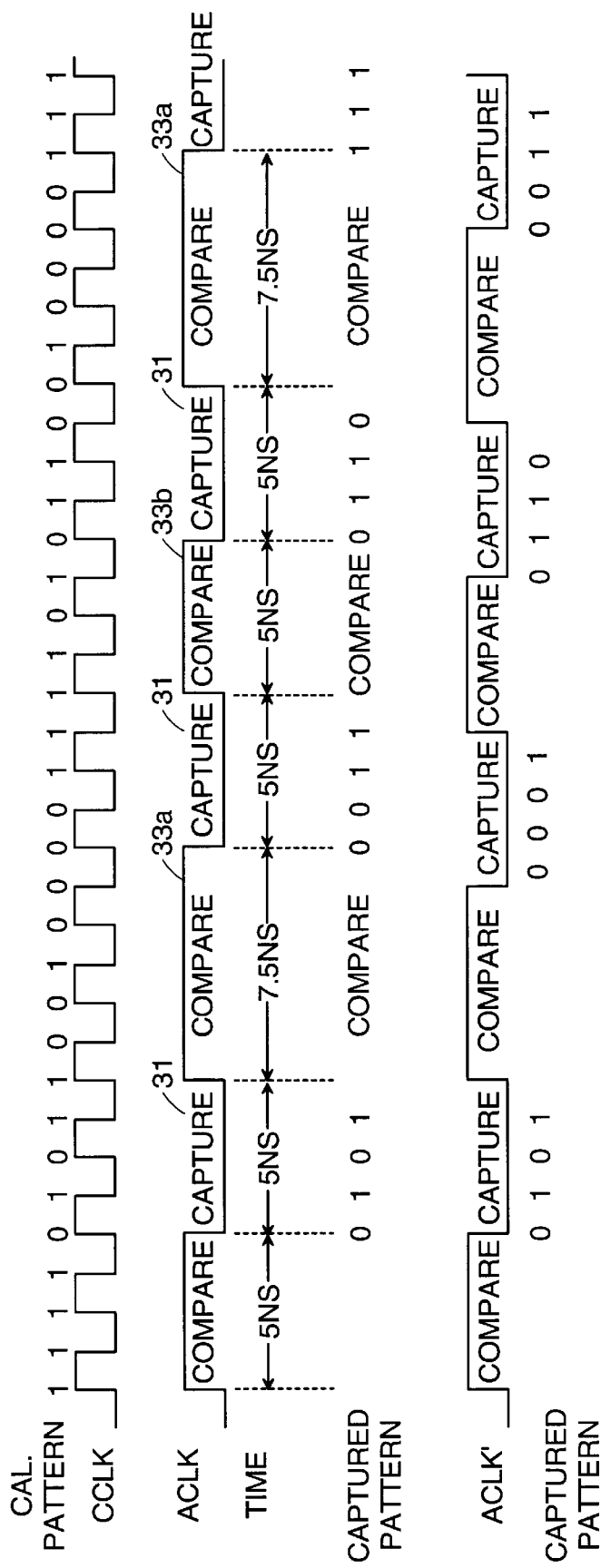
FIG. 3 illustrates signal patterns associated with two exemplary embodiments of a predictive calibration technique performed in accordance with the invention.

The first exemplary embodiment of the invention is now described in greater detail with reference to FIGS. 3 and 4. FIG. 4 is similar to FIG. 1, except that the symmetric clock generator of FIG. 1 is replaced by an asymmetric clock generator 28. In this embodiment, the FIG. 4 asymmetric clock generator 28 produces, from clock signal CCLK, an asymmetric clock signal ACLK which has alternating capture 31 and compare 33a, 33b, 33a periods (FIG. 3). The capture periods 31 are all of equal time duration which corresponds to two cycles (four ticks) of clock signal CCLK, but the compare periods 33a, 33b have different durations. In the illustrated embodiment, compare period 33a has a time duration corresponding to three cycles (six ticks) of clock signal CCLK, while compare period 33b has a time duration corresponding to two cycles (four ticks) of clock signal CCLK. In the illustrated embodiment, successive compare periods 33a, 33b, 33a . . . have time periods which alternate between a first time duration corresponding to two cycles of the CCLK clock signal and a second time duration corresponding to three cycles of the CCLK clock signal.

When the ACLK clock signal illustrated in FIGS. 3 and 4 is employed to enable (load) the register 17 and enable compare circuit 21, the N-bit sequence captured in register 17 and used to predict a subsequent N-bit sequence will continually rotate through the sixteen-bit calibration pattern such that eight four-bit patterns are captured and used to predict a subsequent four-bit pattern. For the timing diagram illustrated in FIG. 3, these are the data patterns "0101," "0011," "0110," "1111," "1001," "1101," "0100" and "0000." As a result, all sixteen bits of the calibration pattern are captured and used and more of the randomness of the even sixteen-bit calibration pattern can be exploited during calibration.

It should be understood that during a compare period, all bits arriving at latch 15 are skipped over, that is, they are not registered in register 17. It is this skipping over of different numbers of bits as the duration of the compare periods vary in duration which permits more, here eight, of the sixteen possible four-bit data patterns of the sixteen-bit calibration pattern to be used for calibration. Four bits are skipped for a compare period corresponding to two cycles of the CCLK signal, while six bits are skipped for a compare period corresponding to three cycles of the CCLK signal.

Thus, looking at the first compare period 33a in FIG. 4, the four bits "0101" are received in register 17 for comparison with the four bits predicted by predictor circuit from the previously captured "0000" four bits. The bits "100100" which arrive at latch 15 during compare period 33a will be skipped over. As a consequence, the next four bits captured by register 17 during the next ensuing capture period 31 will be the bit sequence "0011." This is what causes the captured pattern to eventually cycle through eight four-bit sequences of the sixteen-bit calibration pattern.

Although the embodiment of the invention illustrated in FIGS. 3 and 4 uses alternating compare periods which correspond respectively to two and three cycles of the CCLK clock signal, other timing patterns for the ACLK signal are also possible. For example, the compare periods may alternate between time durations corresponding to two and two-and-one-half cycles of the CCLK clock signal, i.e., between four ticks and five ticks of the CCLK signal, while the capture periods remain at two clock cycles, as shown by the ACLK' signal in FIG. 3. With this arrangement, all sixteen possible four-bit sequences of the sixteen-bit calibration pattern will be captured and used.

Figure 5:
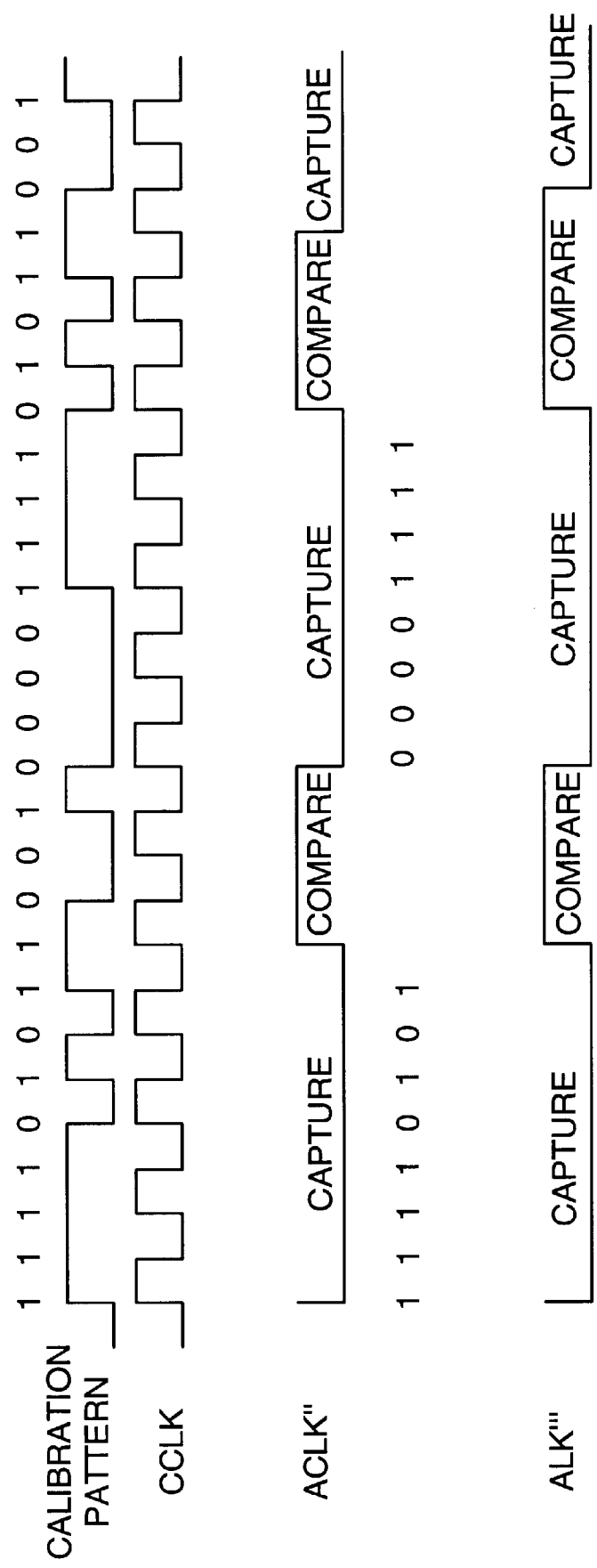
FIG. 5 illustrates signal patterns associated with a third exemplary embodiment of the invention.

Another exemplary embodiment of the invention is illustrated by 5 the timing diagrams of FIG. 5. In this embodiment, which uses the ACLK" signal to define the capture and compare periods, eight bits of the sixteen bit calibration pattern are captured at a time and used to predict a next captured eight-bit pattern. Thus, register 17, predictor circuit 19 and compare circuit 21 of FIG. 4 need now handle eight bits at a time. In this embodiment, the compare periods are of equal duration, e.g. four ticks or two CCLK clock cycles long. With this embodiment, four eight-bit patterns of the sixteen-bit calibration pattern can be captured and used in the predictive calibration process described above. Using the timing illustrated in FIG. 5, the four eight-bit patterns which are captured and used are "11110101," "00001111," "10010000," and "01011001." During each of the compare periods, four incoming bits latched in latch 15 are skipped over. Although the compare period durations do not change in this embodiment, the four eight-bit patterns which are fully captured and used make full use of all sixteen bits of the calibration pattern and thus again exploit the pseudo-random nature of the calibration pattern. It is also possible to vary the duration of the compare periods, as illustrated by the ALK''' clock signal in FIG. 5 to capture and use even more eight-bit patterns of the sixteen-bit calibration pattern in the eight-bit predictive calibration process.

Although exemplary embodiments of the invention have been described and illustrated with respect to use with a sixteen-bit calibration pattern, it should be apparent that the invention may be used with any even-bit calibration pattern. Also, although different exemplary embodiments have been described which capture four bits and eight bits of the calibration pattern, the invention can also be used with other numbers of captured bits.

The invention can be used in a predictive calibration process to calibrate any of the data paths of a memory device which have a single register for capturing incoming data. For example, such data paths include, but are not limited to, the FLAG and command CAØ . . . CA9 data paths of an SLDRAM memory device.

Figure 6:
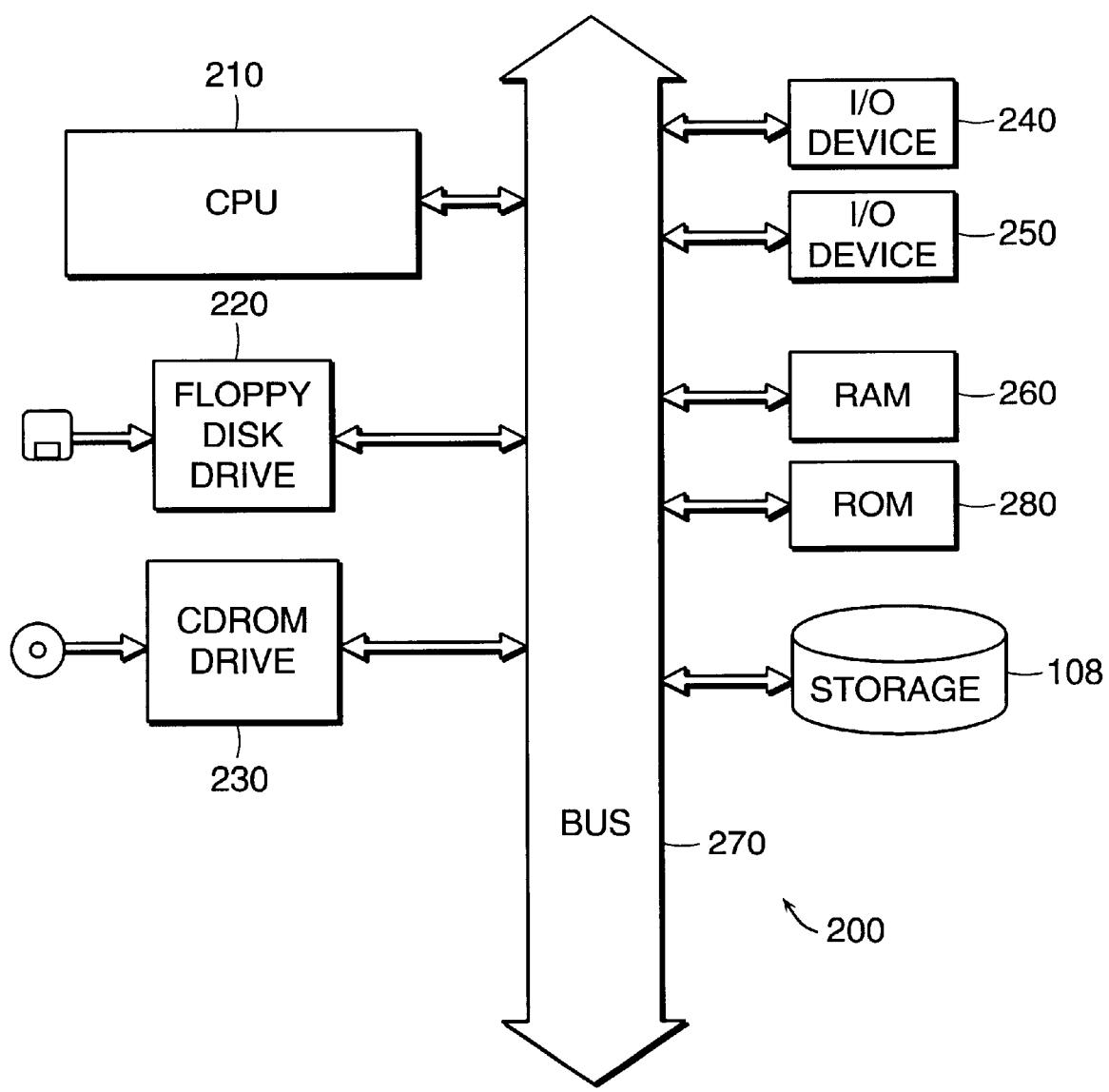
FIG. 6 illustrates a processor system which may employ the invention.

FIG. 6 illustrates a processor system which employs digital circuits having data paths which can be calibrated using a method and apparatus of the invention.

As shown in FIG. 6, a processor based system, such as a computer system, for example, generally comprises a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU processor 210 over the bus 270. The RAM 260 and/or processor 210 are preferably constructed with data paths which can be calibrated using the method and apparatus of the invention described above with reference to FIGS. 3 and 4.

While the invention has been described and illustrated with reference to specific exemplary embodiments, it should be understood that many modifications and substitutions can be made without departing from the spirit and scope of the invention. Accordingly, the invention is not to be considered as limited by the foregoing description but is only limited by the scope of the appended claims.

What is claimed as new and desired to be protected by Letters Patent of the United States is:

1. A method of calibrating a data path of a digital device comprising:
   a) capturing a first predetermined number of bits of a repeating calibration pattern received on said data path during a first capture period corresponding to a first predetermined number of ticks of a clock signal;
   b) predicting a second predetermined number of bits of said repeating calibration pattern to be received on said data path from said first predetermined number of bits;
   c) capturing a third predetermined number of bits of said repeating calibration pattern during a second capture period corresponding to said first predetermined number of ticks of said clock signal;
   d) comparing said predicted second predetermined number of bits with said captured third predetermined number of bits during a compare period corresponding to a second number of ticks of said clock signal;
   e) using the results of said comparison to adjust the relative timing of said received calibration pattern and said clock signal; and
   f) repeating steps "a" through "e" a plurality of times wherein for at least a first number of said times said second number of ticks equals a first number of ticks and for at least a second number of times said second number of ticks does not equal said first number of ticks.

2. The method as in claim 1 wherein said repeating calibration pattern has an even number of bits, and wherein for said first number of said times said first number of ticks is an even number N and wherein for said second number of said times said second number of ticks is at least N+1.

3. The method as in claim 2 wherein for said second number of times said second number of ticks is N+1.

4. The method as in claim 3 wherein said first number of ticks is four ticks and said second number of ticks is five ticks.

5. The method as in claim 2 wherein for said second number of times said second number of ticks is N+2.

6. The method as in claim 1 wherein said repeating calibration pattern has an even number of bits, and wherein said first number of ticks corresponds to M cycles of said clock signal, wherein M is an integer, and said second number of ticks corresponds to at least M+1 cycles of said clock signal.

7. The method as in claim 6 wherein said first number of ticks corresponds to two clock cycles and said second number of ticks for said second number of times corresponds to three clock cycles.

8. The method as in claim 1 wherein said repeating calibration pattern has an even number of bits, and wherein said first and second capture periods correspond to four ticks of said clock signal and said first number of ticks equals four ticks and said second number of ticks equals six ticks.

9. The method as in claim 8 wherein said steps "a" through "e" are repeated until a data eye is established for said received calibration pattern and a tick of said clock signal is positioned at or near the center of said data eye.

10. The method as in claim 9 wherein said data eye is established by stepping a delay element through all possible delay values and noting which delay values cause said comparing step to indicate coincidence between said compared second and third predetermined number of bits, and wherein said positioning comprises picking as a final delay value a delay value which positions a tick of said clock signal at or near the center of said data eye.

11. The method as in claim 1 wherein said relative timing is adjusted by adjusting a delay element in said data path.

12. The method as in claim 1 wherein said digital device is a memory device.

13. The method as in claim 1 wherein said digital device is a processor.

14. The method as in claim 1 wherein said digital device is a memory controller.

15. The method as in claim 1 wherein said plurality of times is sufficient to ensure that all possible bits of said calibration pattern are captured and used in said predicting step.

16. A method of calibrating a data path of a digital device, comprising:
   capturing a first predetermined number of bits of a repeating calibration pattern received on said data path during a first capture period corresponding to a first predetermined number of ticks of a clock signal;
   predicting a second predetermined number of bits of said repeating calibration pattern to be received on said data path from said first predetermined number of bits;
   capturing a third predetermined number of bits of said repeating calibration pattern during a second capture period corresponding to said first predetermined number of ticks of said clock signal;
   comparing said predicted second predetermined number of bits with said captured third predetermined number of bits during a compare period corresponding to a second number of ticks of said clock signal; and
   using the results of said comparison to adjust the relative timing of said received calibration pattern and said clock signal.

* * * * *